(12) United States Patent
Mizutani

(10) Patent No.: US 6,252,474 B1
(45) Date of Patent: Jun. 26, 2001

(54) SEMICONDUCTOR PHASE SHIFTER HAVING HIGH-PASS SIGNAL PATH AND LOW-PASS SIGNAL PATH CONNECTED IN PARALLEL

(75) Inventor: Hiroshi Mizutani, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/222,307

(22) Filed: Dec. 28, 1998

(30) Foreign Application Priority Data

Dec. 26, 1997 (JP) ................................................ 9-360501

(51) Int. Cl.$^7$ ........................................................ H03H 7/20
(52) U.S. Cl. .......................................... 333/139; 333/164
(58) Field of Search .................................. 333/164, 139, 333/156

(56) References Cited

U.S. PATENT DOCUMENTS

| 3,718,873 | * | 2/1973 | Garver | 333/139 X |
| 4,733,203 | * | 3/1988 | Ayasli | 333/139 |
| 5,317,290 | * | 5/1994 | Jacomb-Hood | 333/164 |

FOREIGN PATENT DOCUMENTS

| 208307 | * | 9/1986 | (JP) | 333/164 |
| 1-202007 | | 8/1989 | (JP) | |

OTHER PUBLICATIONS

Robert V. Garver, "Broad–Band Diode Phase Shifter", IEEE Trans. on Microwave Theory and Techniques, vol. MTT–20, No. 5, pp. 314–323, May 1972.

* cited by examiner

*Primary Examiner*—Benny Lee
(74) *Attorney, Agent, or Firm*—Sughrue, Mion, Zinn, Macpeak & Seas, PLLC

(57) ABSTRACT

In a semiconductor phase shifter, a high-pass signal path and a low-pass signal path are connected in parallel between an input terminal and an output terminal. The high-pass signal path in constructed by first and second transmission lines connected to the input and output terminals and having an effective length of $\lambda/4$, where $\lambda$ is a wavelength of propagating signals, at least one first field effect transistor connected between the first and second transmission lines, and at least two third transmission lines each connected of the first field effect transistor and to a ground terminal. The low-pass signal path is constructed by fourth and fifth transmission lines connected to the input and output terminals and having an effective length of $\lambda/4$, at least one sixth transmission line connected between the fourth and fifth transmission lines, and at least two second field effect transistors each connected to the sixth transmission line and to the ground terminal. Each of the third and sixth transmission lines serves as an inductor.

13 Claims, 15 Drawing Sheets

HIGH-PASS STATE $$f_0 = \frac{1}{2\pi\sqrt{LC}}$$

SEMICONDUCTOR PHASE SHIFTER HAVING HIGH-PASS SIGNAL PATH AND LOW-PASS SIGNAL PATH CONNECTED IN PARALLEL

BACKGROUND OF THE INVENTION

1. Field of the Invention

The present invention relates to a semiconductor phase shifter used in a phased array radar or the like.

2. Description of the Related Art

In a first prior art semiconductor phase shifter (See: Robert V. Garver, "Broad-Band Diode Phase Shifters", IEEE Trans. of Microwave Theory and Techniques, Vol. MTT-20, No. 5, pp. 314–323, May 1972), a T-type high-pass filter and a T-type low-pass filter are switched by arranging switches. This will be explained later in detail.

In the first prior art semiconductor phase shifter, however, since two control biases are required, so that the two switches and are required, a large insertion loss is created.

In a second prior art semiconductor phase shifter (see: JP-A-1-202007), only one control bias is provided. This also will be explained later in detail.

In the second prior art semiconductor phase shifter, however, even if the frequency of propagation signals is shifted a little from the desired frequency, the phase shift deviates, so that the semiconductor phase shifter is narrow-band.

SUMMARY OF INVENTION

It is an object of the present invention to provide a semiconductor phase shifter capable of reducing the insertion loss and obtaining a wide bandwidth of operation as well as an increased return loss.

According to the present invention, in a semiconductor phase shifter, a high-pass signal path and a low-pass signal path are connected in parallel between an input terminal and an output terminal. The high-pass signal path is constructed by first and second transmission lines connected to the input and output terminals and having an effective length of $\lambda/4$, where $\lambda$ is a wave length of propagating signals, at least one first field effect transistor connected between the first and second transmission lines, and at least two third transmission lines each connected to the first field effect transistor and to a ground terminal. The low-pass signal path is constructed by fourth and fifth transmission lines connected to the input and output terminals and having an effective length of $\lambda/4$, at least one sixth transmission line connected between the fourth and fifth transmission lines, and at least two second field effect transistors each connected to the sixth transmission line and to the ground terminal. Each of the third and sixth transmission lines serves as an inductor.

BRIEF DESCRIPTION OF THE DRAWINGS

The present invention will be more clearly understood from the description as set below, as compared with the prior art, with reference to the accompanying drawings, wherein.

DETAIL DESCRIPTION OF THE PREFERRED EMBODIMENTS

Before the description of the preferred embodiments, prior art semiconductor phase shifters will be explained with reference to FIGS. 1, 2, 3A, 3B and 4.

Figure 1:
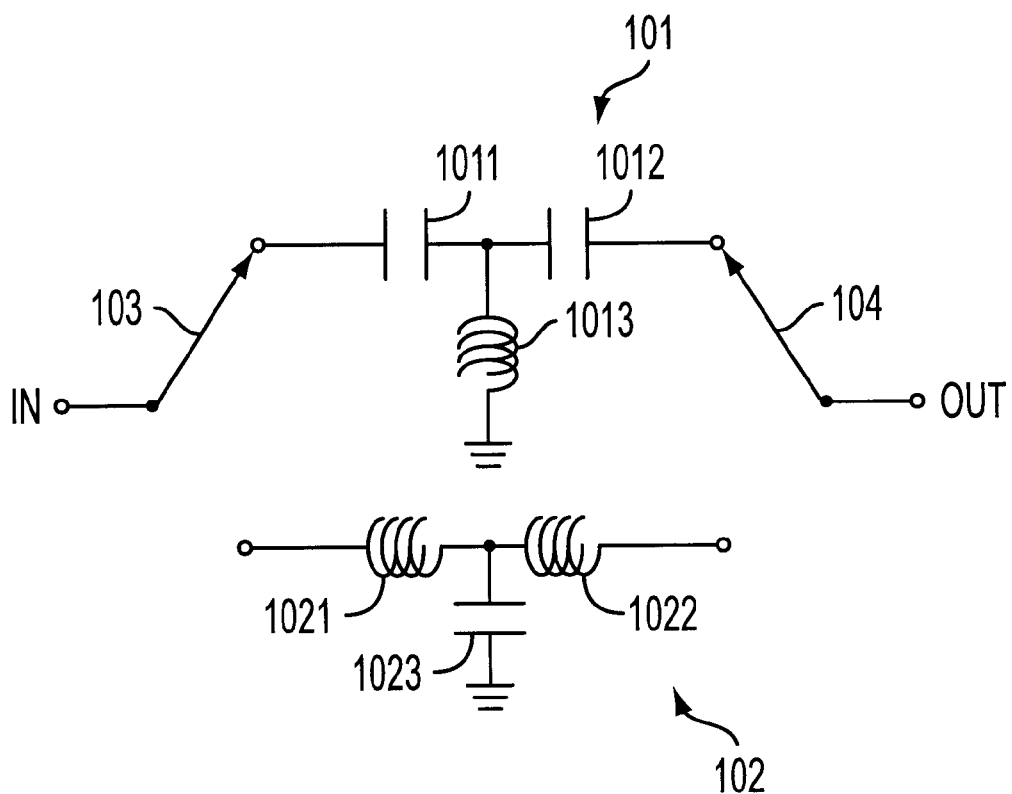
FIG. 1 is a circuit diagram illustrating a first prior art semiconductor phase shifter.

In FIG. 1, which illustrates a first prior art semiconductor phase shifter (see: Robert V. Garver, "Broad-Band Diode Phase Shifters", IEEE Trans. of Microwave Theory and Techniques, Vol. MTT-20, No. 5, pp.314–323, May 1972), a T-type high-pass filter 101 and a T-type low-pass filter 102 are switched by series capacitors 103 and 104. The high-pass filter 101 is formed by series capacitors 1011 and 1012 and a shunt inductor 1013 to provide phase advance. The low-pass filter 102 is formed by series inductors 1021 and 1022 and a shunt capacitor 1023 to provide phase delay. Note that reference IN designates an input terminal and OUT designates and output terminal.

In FIG. 1, when the high-pass filter 101 is activated and the low-pass filter 102 is deactivated, the phase $\phi_H$ of radio frequency signals is represented by $$\phi_H = \tan^{-1}\{(B+2X-BX^2)/2(1-BX)\} \quad (1)$$

where X is a normalized reactance; and

B is a normalized susceptance.

On the other hand, in FIG. 1, when the low pass filter 102 is activated and the high-pass filter 101 is deactivated, the phase $\phi_L$ is represented by $$\phi_L = \tan^{-1}\{-(B+2X-BX^2)/2(1-BX)\} \quad (2)$$

Therefore, from the equations (1) and (2), the phase shift $\Delta \phi$ is given by $$\Delta \phi = \phi_H - \phi_L$$

$$= 2\tan^{-1}\{-(B+2X-BX^2)/2(1-BX)\} \quad (3)$$

In the semiconductor phase shifter of FIG. 1, however, two control biases are required, so that the switches 103 and 104 are required, which creates a large insertion loss.

Figure 2:
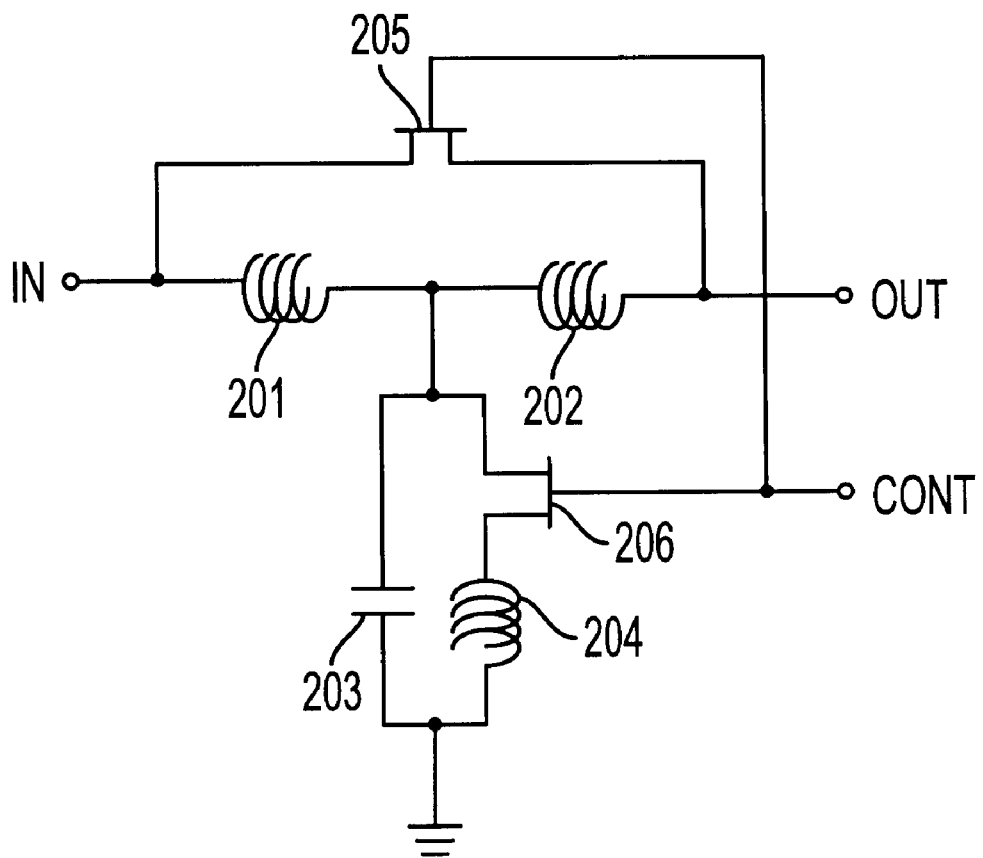
FIG. 2 is a circuit diagram illustrating a second prior art semiconductor phase shifter.

In FIG. 2, which illustrates a second prior art semiconductor phase shifter (see:JP-A-1-202007), only one control bias is provided. That is, series inductors 201 and 202, a shunt capacitor 203, and a shunt inductor 204 are provided. Also, a switch 205 formed by a field effect transistor (FET) is connected between the inductors 201 and 202, and a switch 206 formed by an FET is connected in series to the shunt inductor 204. Note that the FETs 205 and 206 are controlled by a voltage at a control terminal CONT.

Figure 3A:
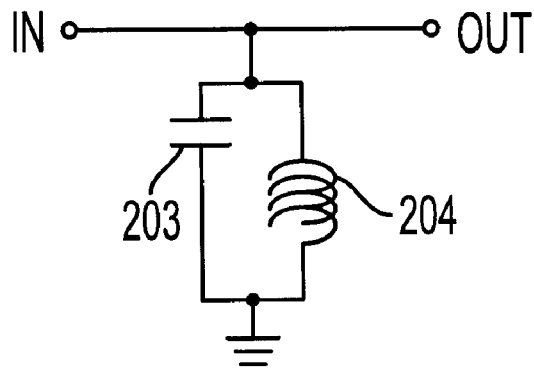
FIGS. 3A and 3B are equivalent circuit diagrams of the semiconductor phase shifter of FIG. 2 where the high-pass signal path is activated and the low-pass signal path is deactivated.
Figure 3B:
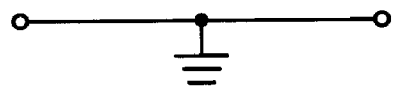

In FIG. 2, when the FETs 205 and 206 are turned ON, the ends of the inductors 201 and 202 are short-circuited, the circuit of FIG. 2 is changed to a T-type high-pass filter as illustrated in FIG. 3A. In this case, if the capacitance C of the capacitor 203 and the inductance L of the inductor 204 are selected to form a resonance circuit at a desired frequency $f_0$, i.e., $$f_0 = 1/(2\pi\sqrt{LC}) \quad (4)$$

then, the circuit of FIG. 2 can be represented by a simple circuit as illustrated in FIG. 3B.

Figure 4:
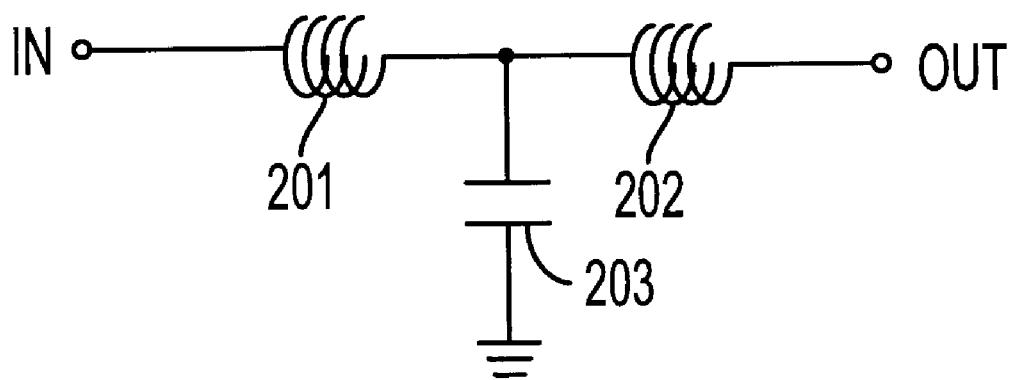
FIG. 4 is an equivalent circuit diagram of the semiconductor phase shifter of FIG. 2 where the low-pass signal path is activated and the high-pass signal path is deactivated.

On the other hand, in FIG. 2, when the FETs 205 and 206 are turned OFF, the circuit of FIG. 2 is represented by a T-type low-pass filter as illustrated in FIG. 4.

Therefore, from the equation (4), the phase shift $\Delta\phi$ is given by $$\Delta\phi = 2\pi f_0 \sqrt{LC} \quad (5)$$

In the semiconductor phase shifter of FIG. 2, however, even if the frequency of propagation signals is shifted a little from the desired frequency $f_0$, the phase shift $\Delta\phi$ deviates, so that the semiconductor phase shifter of FIG. 2 is narrowband.

Figure 5:
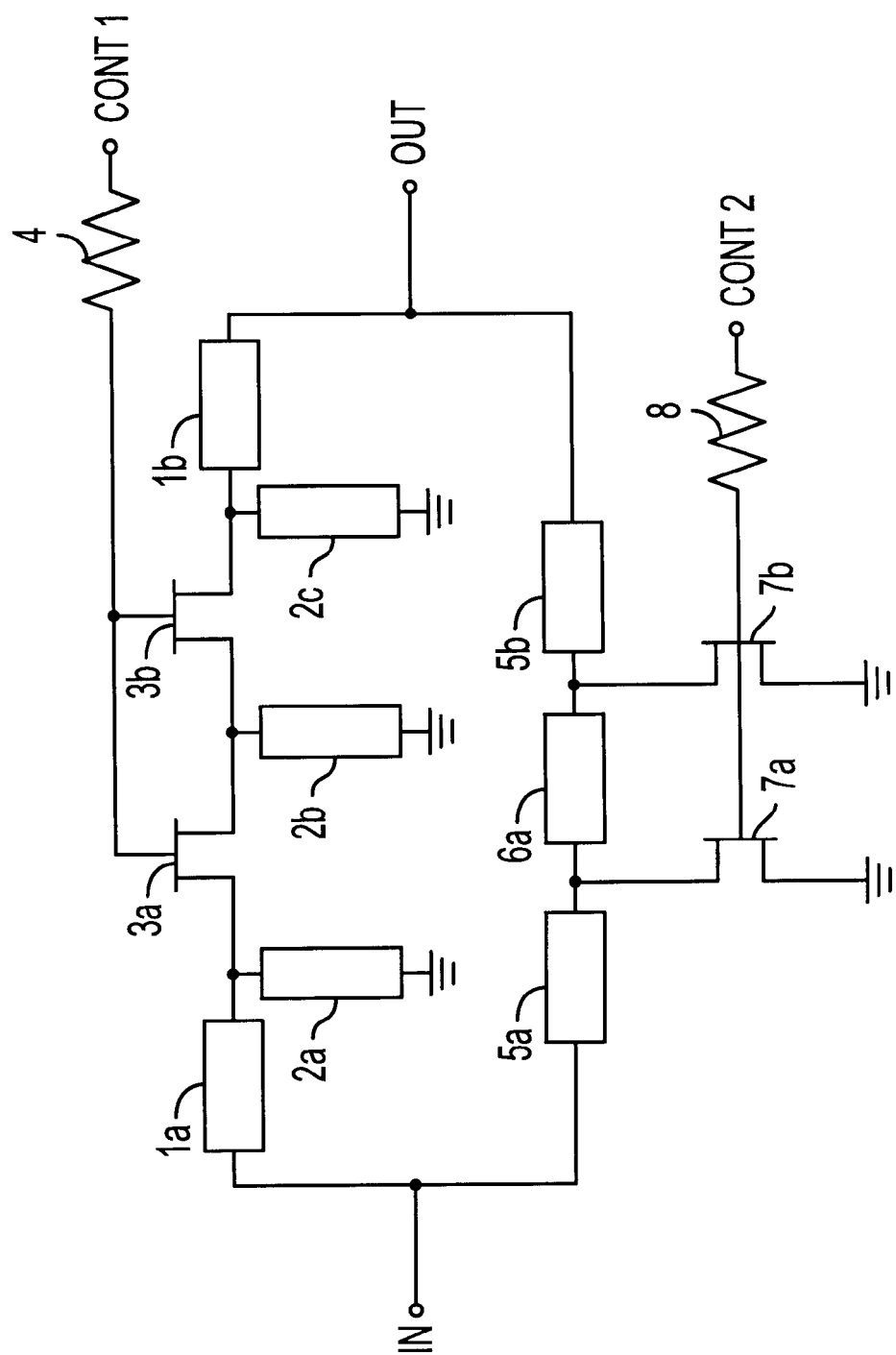
FIG. 5 is a circuit diagram illustrating a first embodiment of the semiconductor phase shifter according to the present invention.

In FIG. 5, which illustrates a first embodiment of the present invention, a high-pass signal path is constructed by transmission lines 1a and 1b each having an effective length $\lambda/4, 3\lambda/4, 5\lambda/4, \ldots$, where $\lambda$ is a wavelength of propagating signals, transmission lines 2a, 2b and 2c serving as inductors, and switches formed by FETs 3a and 3b connected between the transmission lines 1a and 1b and controlled by a voltage at a control terminal CONT1 via an isolation resistor 4.

Also, a low-pass signal path is constructed by transmission lines 5a and 5b each having an effective length of $\lambda/4, 3\lambda/4, 5\lambda/4, \ldots$, a transmission line 6a serving as an inductor and connected between the transmission lines 5a and 5b, and switches formed by FETs 7a and 7b connected to the transmission lines 5a and 5b, respectively and controlled by a voltage at a control terminal CONT2 via an isolation resistor 8.

As previously stated with respect to the prior art, reference IN designates an input terminal and OUT designates an output terminal. Hereinafter, as illustrated by the appended drawings, like reference numerals are used to designate like elements.

Generally, note that the effective length of each of the transmission lines 1a, 1b, 5a and 5b, which may be different from each other, is represented by (2n+1)λ/4 where n is 0, 1, 2, . . .

Figure 6A:
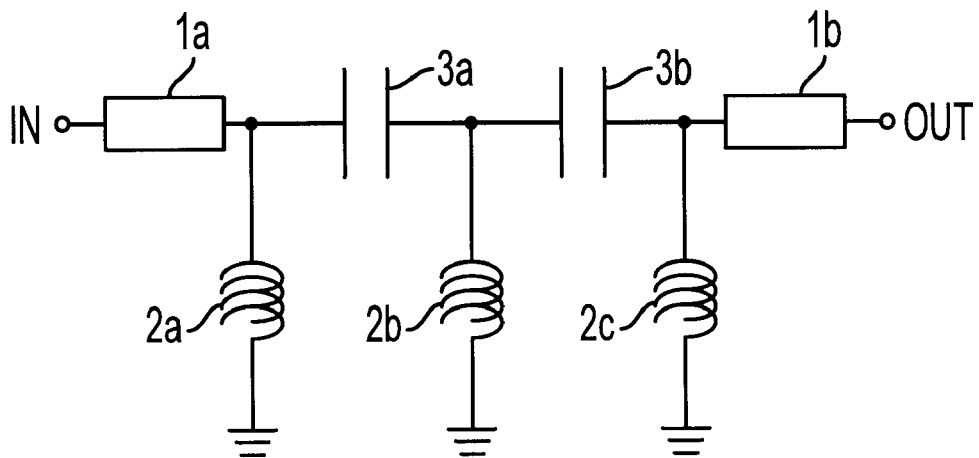
FIGS. 6A and 6B are equivalent circuit diagrams of the semiconductor phase shifter of FIG. 5; in the high pass state and low-pass state respectively.

In FIG. 5, when the FETs 3a and 3b are turned OFF by the voltage at the control terminal CONT1 and the FETs 7a and 7b are turned ON by the voltage at the control terminal CONT2, the circuit of FIG. 5 is changed to a high-pass filter as illustrated in FIG. 6A; to provide phase advance. In this case, the transmission lines 5a and 5b are grounded, so that no reflection occurs therefrom.

Figure 6B:
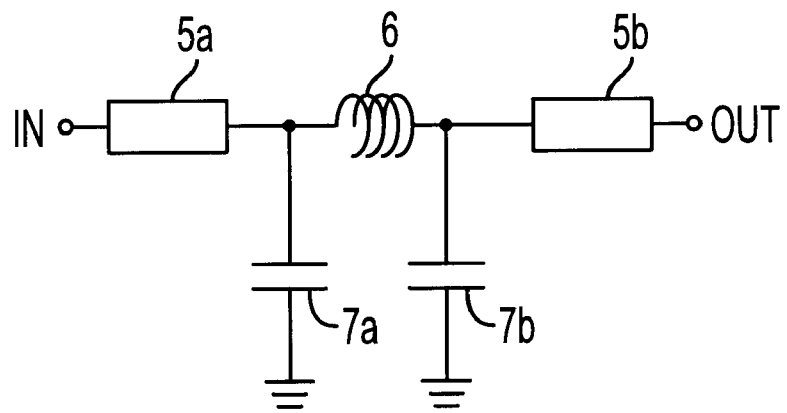

On the other hand, in FIG. 5, when the FETs 3a and 3b are turned ON by the voltage at the control terminal CONT1 and the FETs 7a and 7b are turned OFF by the voltage at the control terminal CONT2, the circuit of FIG. 5 is changed to a low-pass filter as illustrated in FIG. 6B, to provide phase delay. In this case, the transmission lines 1a and 1b are grounded, so that no reflection occurs therefrom.

In the semiconductor phase shifter of FIG. 5, since the FETs 3a, 3b, 7a and 7b serve as inductors as well as switches for switching the high-pass signal path and the low-pass signal path, the switches 103 and 104 of the semiconductor phase sifter of FIG. 1 are unnecessary, which reduces the insertion loss.

Figure 7:
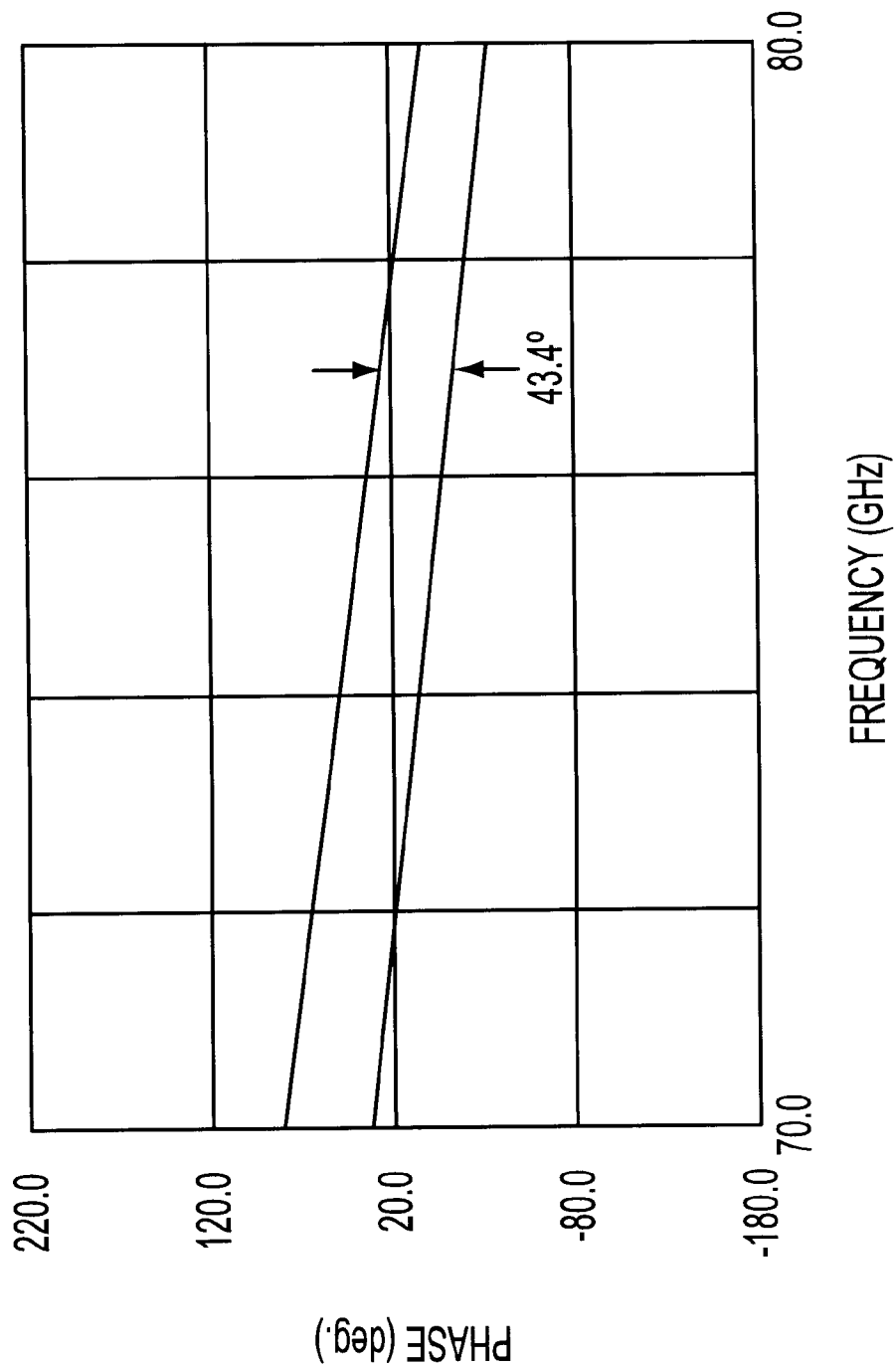
FIG. 7 is a graph showing the phase shift characteristics of the semiconductor phase shifter of FIG. 5.

In an example of the semiconductor phase shifter of FIG. 5, each of the FETs 3a, 3b, 7a and 7b is an AlGaAs heretrojunction FET having a gate length of 0.15 $\mu$m and a gate width 100 $\mu$m. In this case, when this FET is turned ON, the On resistance is 8 $\Omega$. Each of the transmission lines 1a and 1b is a microstrip line having a width of 10 $\mu$m and a length of 280 $\mu$m, and each of the transmission lines 2a, 2b and 2c is a microstrip line having a width of 10 $\mu$m and a length of 190 $\mu$m. Also, each of the transmission lines 5a and 5b is a microstrip line having a width of 10 $\mu$m and a length of 350 $\mu$m and, the transmission line 6a is a microstrip line having a width of 10 $\mu$m and a length of 260 $\mu$m. The phase characteristics of the above-mentioned example of the semiconductor phase shifter of FIG. 5 are as shown in FIG. 7. That is, the phase shift is 43.4° at a frequency of 77 GHz. Also, good phase shift is observed over a wide bandwidth from 70 GHz to 80 GHz. Further, the insertion loss at 77 GHz is small and is less than 1.2 dB, and the return loss at 77 GHz is large and is more than 25 dB.

Figure 8:
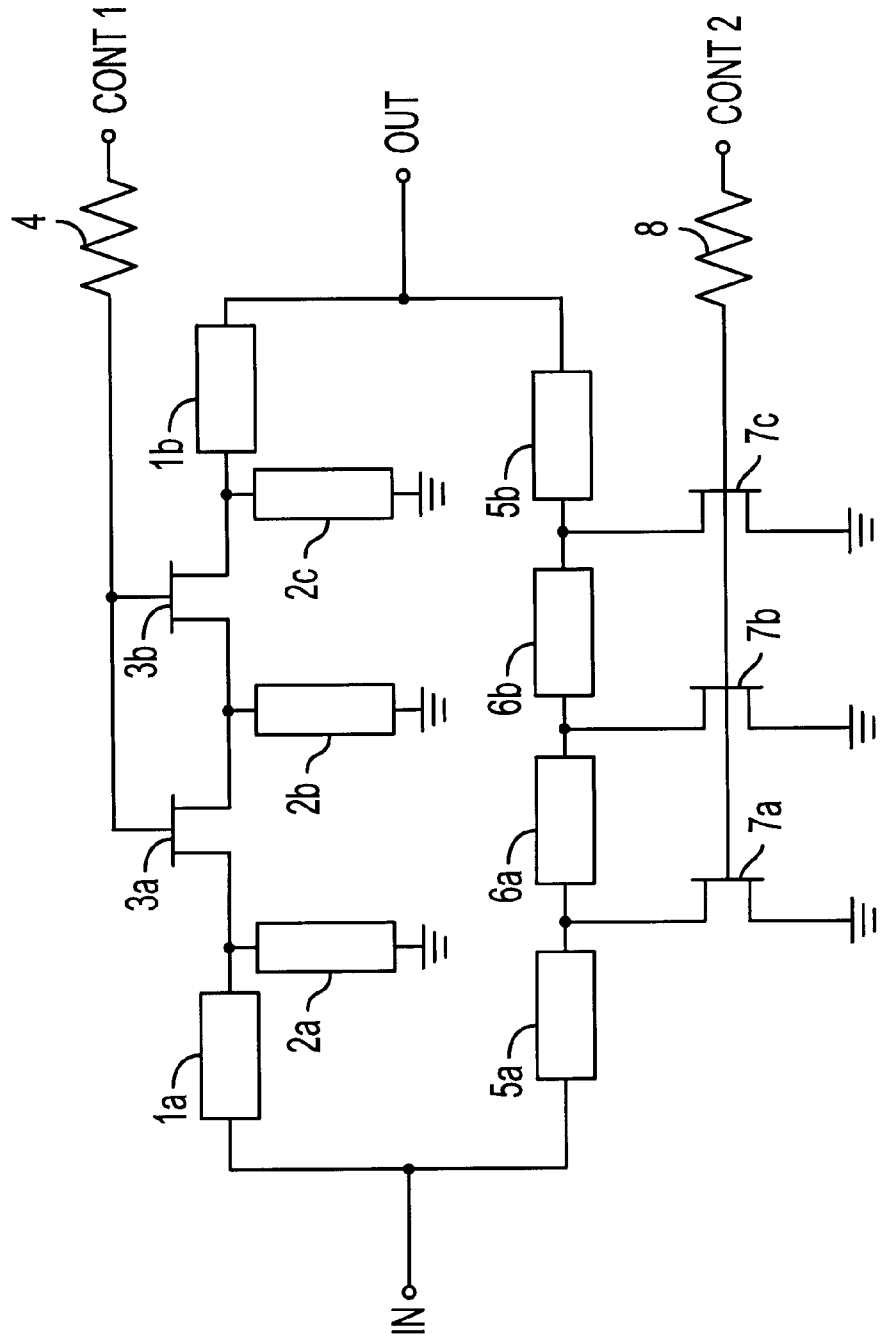
FIG. 8 is a circuit diagram illustrating a second embodiment of the semiconductor phase shifter according to the present invention.

In FIG. 8 which illustrates a second embodiment of the present invention, a transmission line 6b having the same structure as the transmission line 6a of FIG. 5 and a switch formed by an FET 7c having the same structure as the FETs 7a and 7b are added to the low-pass signal path of FIG. 5.

Figure 9A:
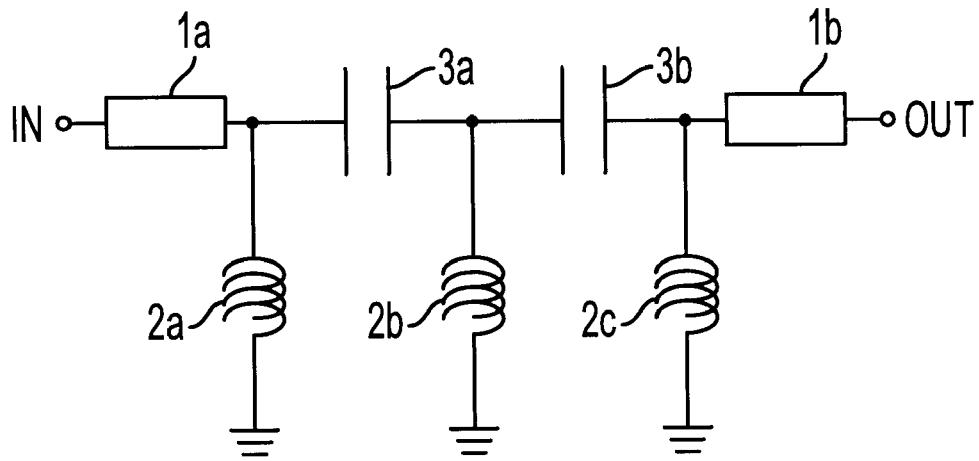
FIGS. 9A and 9B are equivalent circuit diagrams of the semiconductor phase shifter of FIG. 8; in the high-pass and low-pass state respectively.

In FIG. 8, when the FETs 3a and 3b are turned OFF by the voltage at the control terminal CONT1 and the FETs 7a, 7b and 7c are turned ON by the voltage at the control terminal CONT2, the circuit of FIG. 8 is changed to a high-pass filter as illustrated in FIG. 9A, to provide phase advance. In this case, the transmission lines 5a and 5b are grounded, so that no reflection occurs therefrom.

Figure 9B:
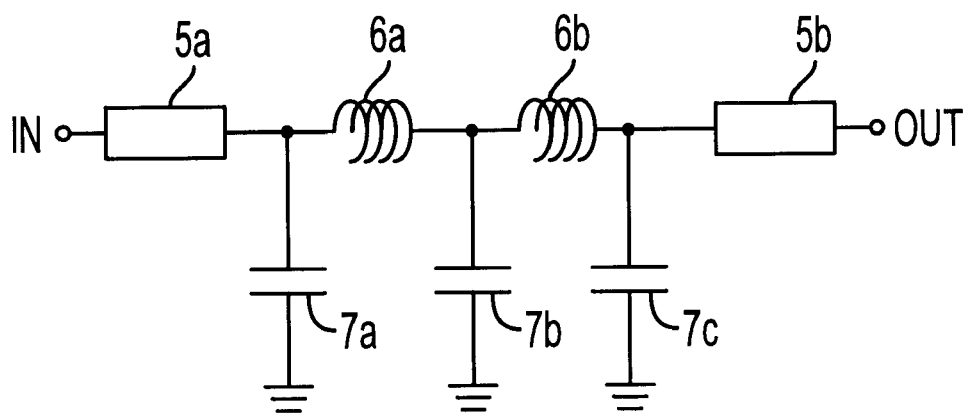

On the other hand, in FIG. 8, when the FETs 3a and 3b are turned ON by the voltage at the control terminal CONT1 and the FETs 7a, 7b and 7c are turned OFF by the voltage at the control terminal CONT2, the circuit of FIG. 8 is changed to a low-pass filter as illustrated in FIG. 9B, to provide phase delay. In this case, the transmission lines 1a and 1b are grounded, so that no reflection occurs therefrom.

Also, in the semiconductor phase shifter of FIG. 8, since the FETs 3a, 3b, 7a, 7b and 7c serve as inductors as well as switches for switching the high-pass signal path and the low-pass signal path, the switches 103 and 104 of the semiconductor phase shifter of FIG. 1 are unnecessary, which reduces the insertion loss.

Figure 10:
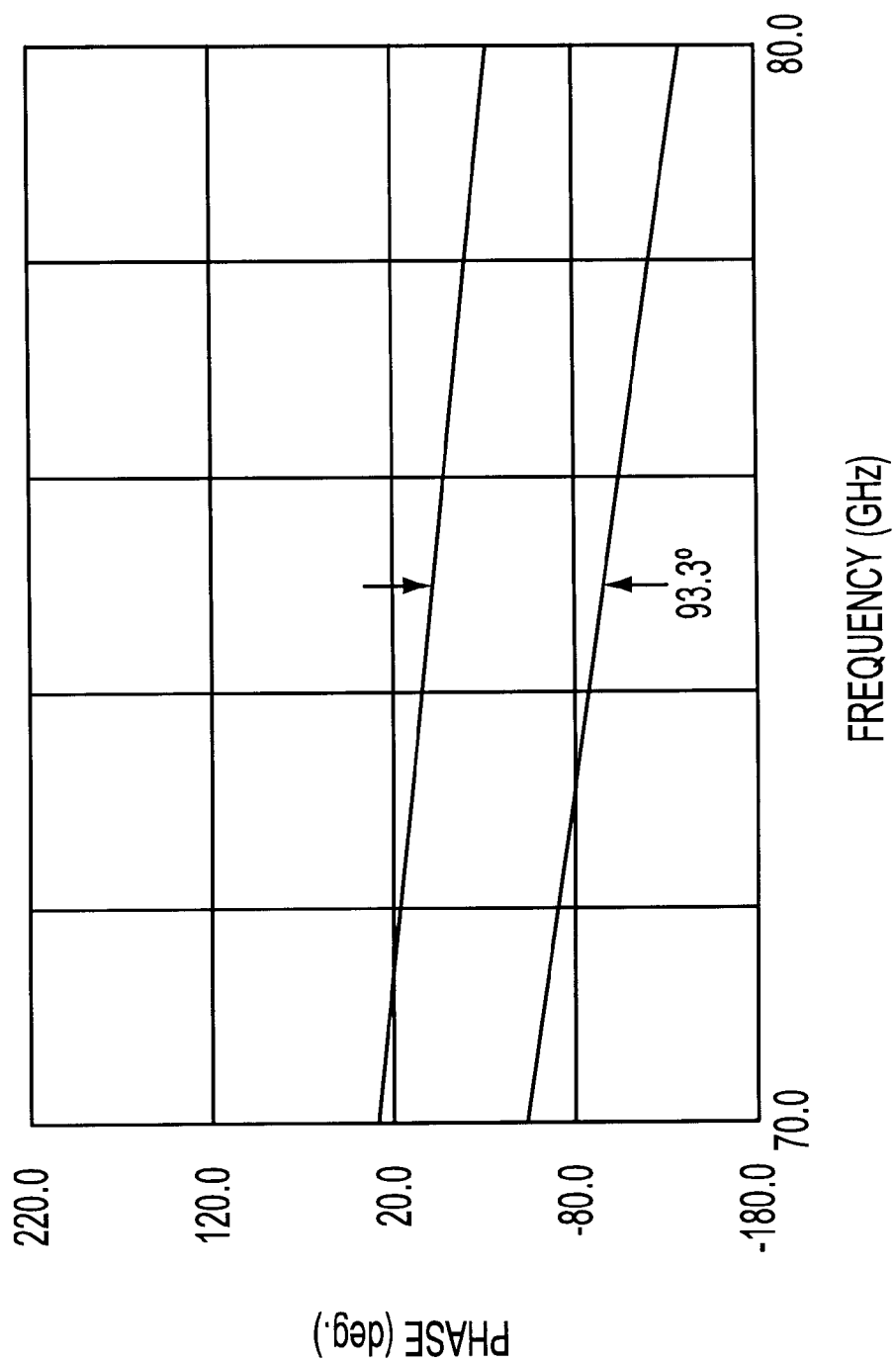
FIG. 10 is a graph showing the phase shift characteristics of the semiconductor phase shifter of FIG. 8.

The phase characteristics of the semiconductor phase shifter of FIG. 8 having the same size characteristics of the above-mentioned example are as shown in FIG. 10. That is, the phase shift is 93.3° at a frequency of 75 GHz. Also, good phase shift is observed over a wide bandwidth from 70 GHz to 80 GHz. Further, the insertion loss at 75 GHz is small and is less than 1.3 dB, and the return loss at 75 GHz is large and is more than 22 dB.

Figure 11:
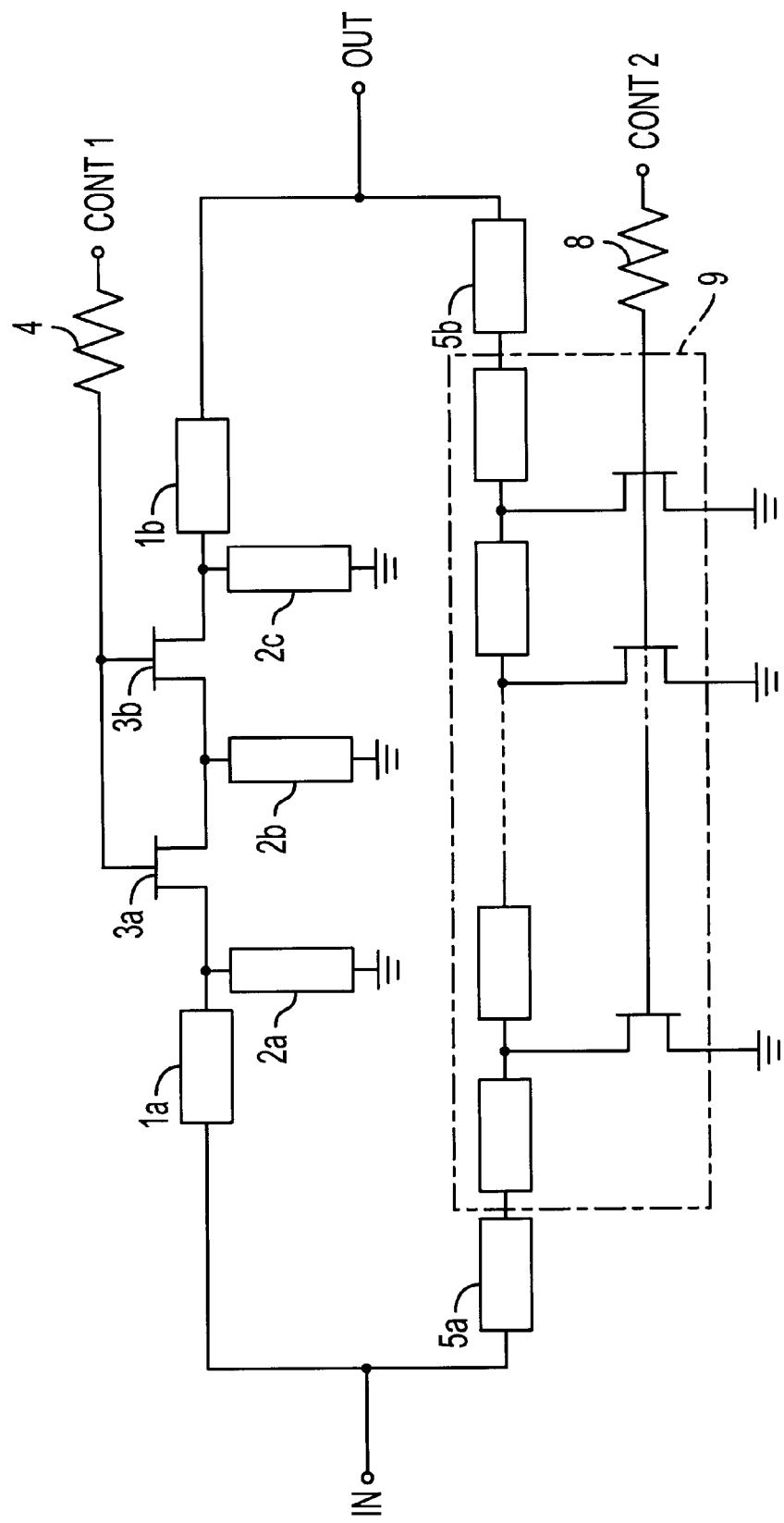
FIG. 11 is a circuit diagram illustrating a third embodiment of the semiconductor phase shifter according to the present invention.

In FIG. 11, which illustrates a third embodiment of the present invention, a distributed parameter FET 9 is provided instead of the transmission lines 6a and 6b and the FETs 7a, 7b and 7c of FIG. 8. The distributed FET 9 is constructed by a transistor including a gate electrode and first and second ohmic electrodes sandwiching the gate electrode, where the first ohmic electrode is grounded and the ends of the second ohmic electrode services as input and output terminals of the FET 9, and an active layer surrounding the transistor. The gate electrode of the distributed FET 9 is connected via the isolation resistor 8 to the control terminal CONT2.

Figure 12:
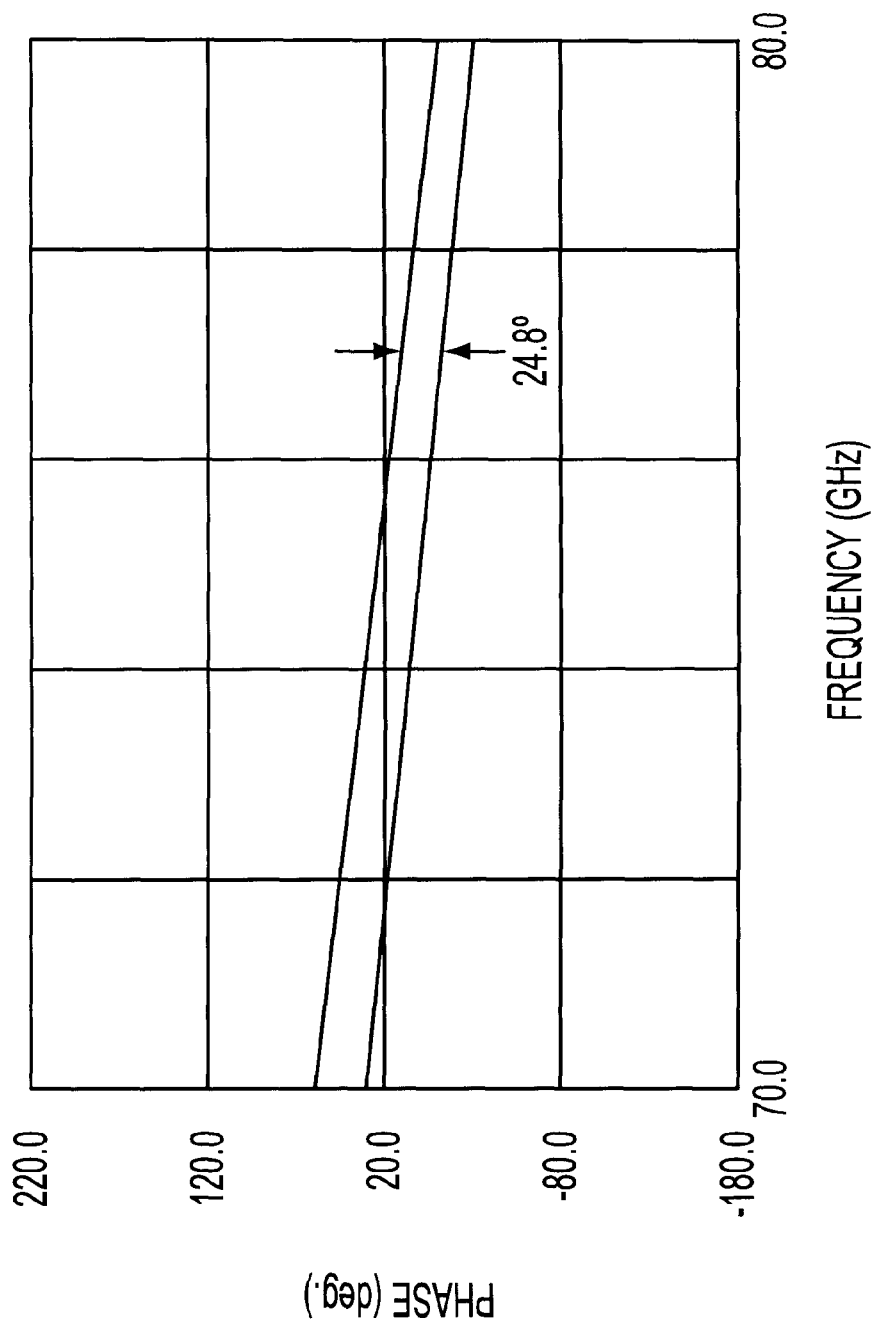
FIG. 12 is a graph showing the phase shift characteristics of the semiconductor phase shifter of FIG. 11.

In an example of the semiconductor phase shifter of FIG. 11, each of the FETs 3a and 3b is an AlGaAs heterojunction FET having a gate length of 0.15 $\mu$m and a gate width 100 $\mu$m. In this case, when this FET is turned OFF the capacitance is 40 f, and when this FET is turned ON, the On resistance is 8 $\Omega$. Each of the transmission lines 1a and 1b is a microstrip line having a width of 10 $\mu$m and a length of 280 $\mu$m, and each of the transmission lines 2a, 2b and 2c is a microstrip line having a width of 10 $\mu$m and a length of 280 $\mu$m. Also, each of the transmission lines 5a and 5b is a microstrip line having a width of 10 $\mu$m and a length of 190 $\mu$m. Also, the distributed parameter FET 9 has a drain electrode width of 30 $\mu$m and a gate finger length of 400 $\mu$m. The phase characteristics of the above-mentioned example of the semiconductor phase shifter of FIG. 11 are as shown in FIG. 12. That is, the phase shift is 24.8° at a frequency of 77 GHz. Also, good phase shift is observed over a wide bandwidth from 70 GHz to 80 GHz. Further, the insertion loss at 77 GHz is small and is less than 1.4 dB, and the return loss at 77 GHz is large and is more than 23 dB.

Figure 5A:
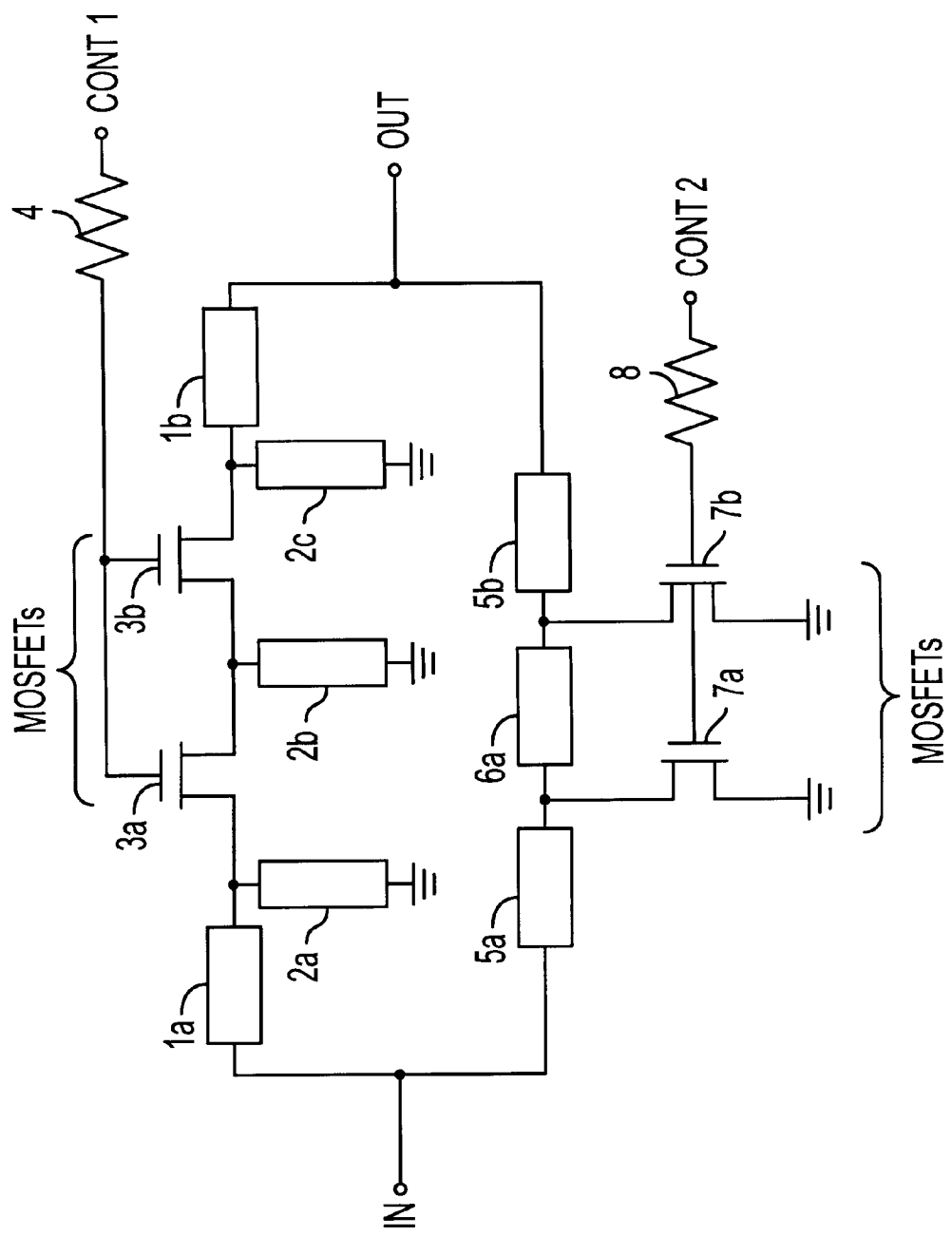
FIG. 5a shows the same circuit implemented with MOSFET transistors.
Figure 8A:
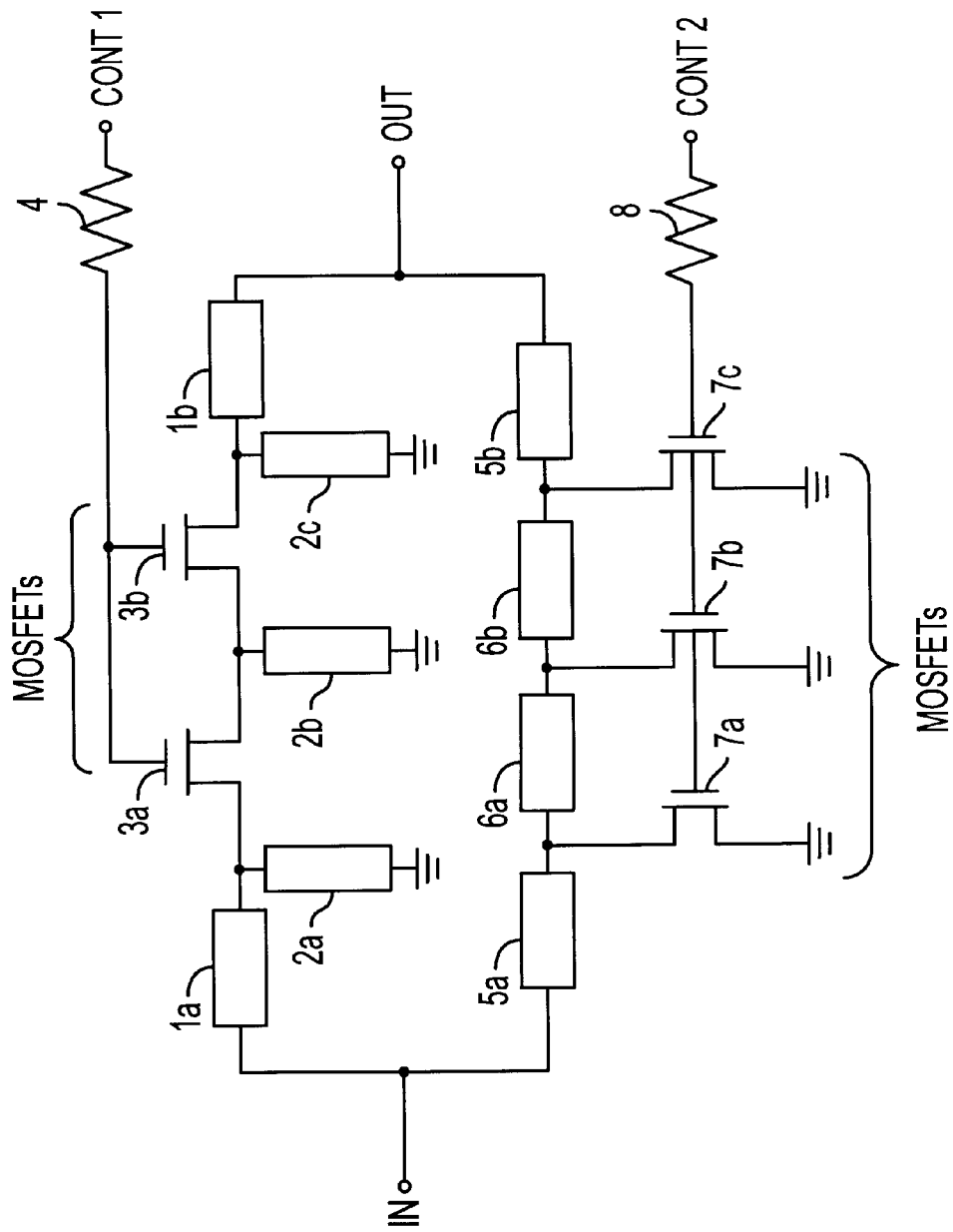
FIG. 8a shows the same circuit implemented with MOSFET transistors.

In the above-mentioned embodiments, although three transmission lines 2a, 2b and 2c and two FETs 3a and 3b are provided in the high-pass signal path, two, four or more transmission lines and one, three or more FETs can be provided. Similarly, in the first and second embodiments, although one or two transmission lines 6a and 6b and two or three FETs 7a, 7b and 7c are provided in the low-pass signal path, three or more transmission lines and four or more FETs can be provided. Also, the FETs of the above-described embodiments--can be constructed by MOS FETs as shown in FIGS. 5a and 8a.

Figure 13:
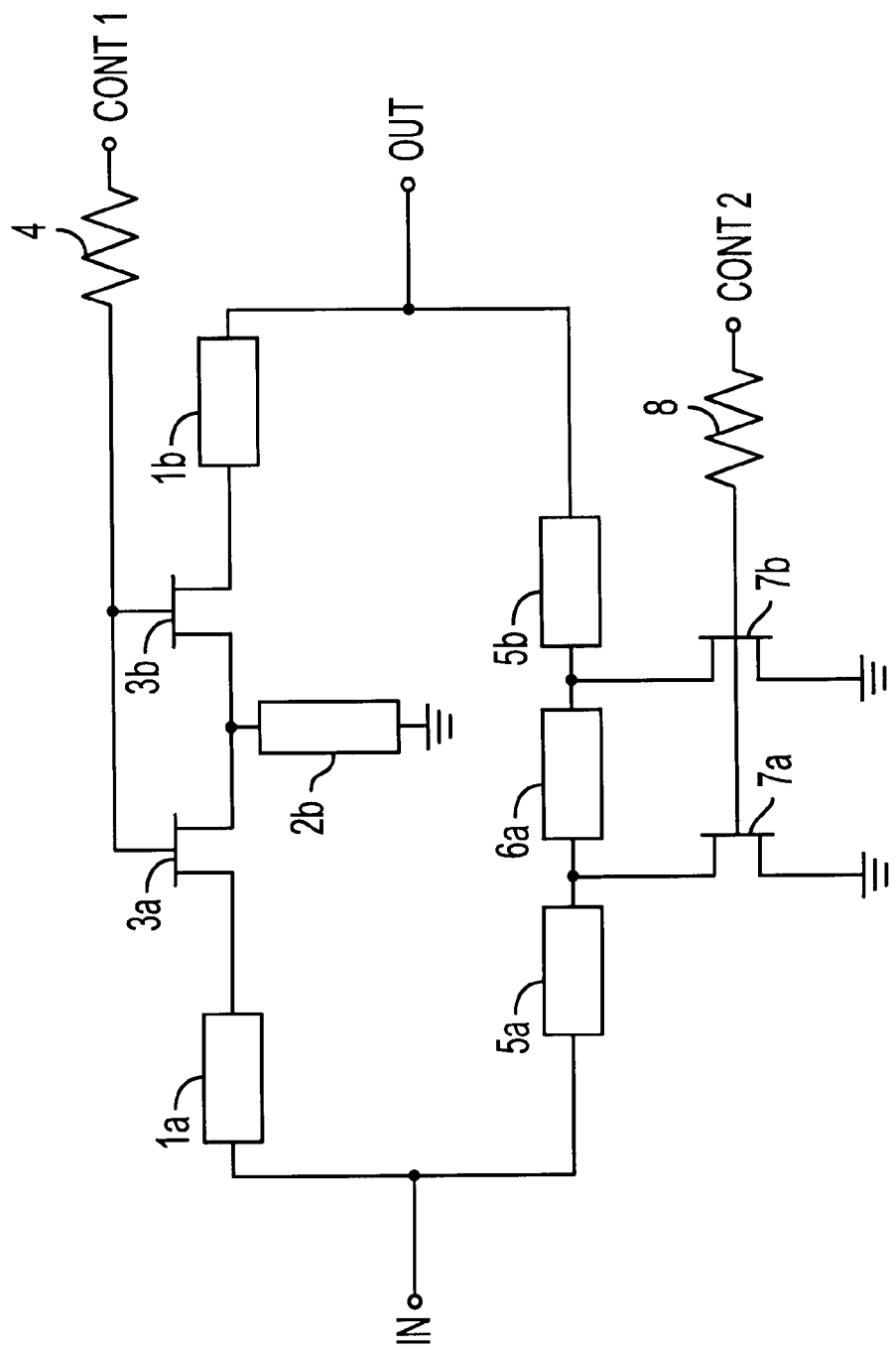
FIG. 13 is a circuit diagram illustrating a modification of the semiconductor phase shifter of FIG. 5.

Also, the present invention can be applied to a semiconductor phase shifter having a T-type high pass filter as illustrated in FIG. 13.

As explained hereinabove, according to the present invention, the insertion loss can be reduced, and also, a wide bandwidth of operation can be obtained. Further, the return loss can be increased.

What is claimed is:

1. A semiconductor phase shifter, comprising
an input terminal;
an output terminal; and
a high-pass signal path and a low-pass signal path connected in parallel between said input terminal and said output terminal,
said high-pass signal path comprising:
a first transmission line connected to said input terminal and having an effective length of $(2n_1+1)\cdot\lambda/4(n_1=0$ to n), where $\lambda$ is a wavelength of a propagating signal and n is a positive integer;
a second transmission line connected to said output terminal and having an effective length of $(2n_2+1)\cdot\lambda/4(n_2=0$ to n);
a first field effect transistor connected between said first and second transmission lines; and
at least two third transmission lines each connected to said first field effect transistor and to a ground terminal, each of said at least two third transmission lines serving as a respective inductor,
said low-pass signal path comprising:
a fourth transmission line connected to said input terminal and having an effective length of $(2n_3+1)\cdot\lambda/4(n_3=0$ to n);
a fifth transmission line connected to said output terminal and having an effective length of $(2n_4+1)\cdot\lambda/4(n_4=0$ to n); and
a distributed field effect transistor connected between said fourth and fifth transmission lines.

2. The semiconductor phase shifter as set forth in claim 1, wherein said distributed field effect transistor comprises:
a transistor having a gate electrode sandwiched by first and second ohmic electrodes, wherein ends of said second ohmic electrode serve as input and output terminals of said distributed parameter transistor and wherein said first ohmic electrode is grounded; and
an active layer surrounding said transistor.

3. A semiconductor phase shifter, comprising
an input terminal;
an output terminal; and
a high-pass signal path and a low-pass signal path connected in parallel between said input terminal and said output terminal,
said high-pass signal path comprising:
a first transmission line connected to said input terminal and having an effective length of $(2n_1+1)\cdot\lambda/4(n_1=0$ to n), where $\lambda$ is a wavelength of a propagating signal and n is a positive integer;
a second transmission line connected to said output terminal and having an effective length of $(2n_2+1)\cdot\lambda/4(n_2=0$ to n);
a first field effect transistor connected between said first and second transmission lines; and
at least two third transmission lines each connected to said first field effect transistor and to a ground terminal, each of said at least two third transmission lines serving as a respective inductor,
said low-pass signal path comprising:
a fourth transmission line connected to said input terminal and having an effective length of $(2n_3+1)\cdot\lambda/4(n_3=0$ to n);
a fifth transmission line connected to said output terminal and having an effective length of $(2n_4+1)\cdot\lambda/4(n_2=0$ to n);
a sixth transmission line connected between said fourth and fifth transmission lines, said sixth transmission line serving as an inductor; and
two second field effect transistors each connected to said sixth transmission line and to said ground terminal.

4. The semiconductor phase shifter as set forth in claim 3, further comprising:
a first control terminal connected to a gate electrode of said first field effect transistor; and
a second control terminal connected to respective gate electrodes of each of said two second field effect transistors.

5. The semiconductor phase shifter as set forth in claim 3, wherein each of said first and second field effect transistors are AlGaAs heterojunction field effect transistors.

6. The semiconductor phase shifter as set forth in claim 1, wherein each of said first and second field effect transistors are a MOS field effect transistors.

7. A semiconductor phase shifter, comprising
an in put terminal;
an output terminal; and
a high-pass signal path and a low-pass signal path connected in parallel between said input terminal and said output terminal,
said high-pass signal path comprising:
  a first transmission line connected to said input terminal and having an effective length of $(2n_1+1)\cdot\lambda/4(n_1=0$ ton), where $\lambda$ is a wavelength of a propagating signal and n is a positive integer;
  a second transmission line connected to said output terminal and having an effective length of $(2n_2+1)\cdot\lambda/4(n_2=0$ to n);
  two first field effect transistors connected between said first and second transmission lines; and
  a third transmission connected to said two first field effect transistors and to a ground terminal, said third transmission line serving as an inductor,
said low-pass signal path comprising:
  a fourth transmission line connected to said input terminal and having an effective length of $(2n_3+1)\cdot\lambda/4(n_3=0$ to n);
  a fifth transmission line connected to said output terminal and having an effective length of $(2n_4+1)\cdot\lambda/4(n_4=0$ to n); and
  a distributed field effect transistor connected between said fourth and fifth transmission lines.

8. The semiconductor phase shifter as set forth in claim 7, wherein said distributed field effect transistor comprises:
  a transistor having a gate electrode sandwiched by first and second ohmic electrodes, wherein ends of said second ohmic electrode serve as input and output terminals of said distributed parameter transistor and wherein said first ohmic electrode is grounded; and
  an active layer surrounding said transistor.

9. A semiconductor phase sifter, comprising
an input terminal;
an output terminal; and
a high-pass signal path and a low-pass signal path connected in parallel between said input terminal and said output terminal,
said high-pass signal path comprising:
  a first transmission line connected to said input terminal and having an effective length of $(2n_1+1)\cdot\lambda/4(n_1=0$ to n), where $\lambda$ is a wavelength of a propagating signal and n is a positive integer;
  a second transmission line connected to said output terminal and having an effective length of $(2n_2+1)\cdot\lambda/4(n_2=0$ to n);
  two first field effect transistors connected between said first and second transmission lines; and
  a third transmission connected to said two first field effect transistors and to a ground terminal, said third transmission line serving as an inductor,
said low-pass signal path comprising:
  a fourth transmission line connected to said input terminal and having an effective length of $(2n_3+1)\cdot\lambda/4(n_3=0$ to n);
  a fifth transmission line connected to said output terminal and having an effective length of $(2n_4+1)\cdot\lambda/4(n_4=0$ to n);
  a sixth transmission line connected between said fourth and fifth transmission lines, said sixth transmission line serving as an inductor; and
  two second field effect transistors each connected to said sixth transmission line and to said ground terminal.

10. The semiconductor phase shifter as set forth in claim 9, further comprising:
  a first control terminal connected to a respective gate electrode of each of said two first field effect transistors; and
  a second control terminal connected to respective gate electrodes of each of said two second field effect transistors.

11. The semiconductor phase shifter as set forth in claim 9, wherein each of said first and second field effect transistors are AlGaAs heterojunction field effect transistors.

12. The semiconductor phase shifter as set forth in claim 9, wherein each of said first and second field effect transistors are MOS field effect transistors.

13. A semiconductor phase shifter, comprising:
an input terminal
an output terminal; and
a high-pass signal path and a low-pass signal path connected in parallel between said input terminal and said output terminal,
said high-pass signal path comprising:
  a first field effect transistor; and
  two first transmission lines each connected to said first field effect transistor and to a ground terminal, each of said first transmission lines serving as a ground inductor,
said low-pass signal path comprising:
  a second transmission line serving as an inductor; and
  two second field effect transistors each connected to said second transmission line and to said ground terminal.

* * * * *